United States Patent [19]

Oberbach

[11] Patent Number: 4,556,757

[45] Date of Patent: Dec. 3, 1985

[54] PROTECTIVE COVER AGAINST RADIATION

[75] Inventor: Josef Oberbach, Grunwald, Fed. Rep. of Germany

[73] Assignee: Michael Geiseler DBF-Vertriebs-GmbH, Munich, Fed. Rep. of Germany

[21] Appl. No.: 514,767

[22] PCT Filed: Sep. 23, 1982

[86] PCT No.: PCT/EP82/00214

§ 371 Date: Jun. 20, 1983

§ 102(e) Date: Jun. 20, 1983

[87] PCT Pub. No.: WO83/01149

PCT Pub. Date: Mar. 31, 1983

[30] Foreign Application Priority Data

Sep. 23, 1981 [DE] Fed. Rep. of Germany ....... 3137853

[51] Int. Cl.[4] ............................................. H05K 9/00
[52] U.S. Cl. .................................... 174/35 R; 5/482; 250/519.1; 339/277 R
[58] Field of Search ................ 174/35 R, 35 MS, 5 R, 174/5 SG, 36; 250/519.1; 5/502, DIG. 1, 482, 483, 500; 54/79; 330/68, 170; 331/67; 334/85; 128/303.13, 798; 339/14 L, 277 R

[56] References Cited

U.S. PATENT DOCUMENTS

| 1,989,282 | 1/1935 | Kimble ............................... 128/798 |
| 2,983,821 | 5/1961 | Cap . |
| 2,983,948 | 3/1960 | Silversher . |
| 3,390,491 | 7/1968 | Hayden et al. . |
| 4,297,522 | 10/1981 | Jesse et al. ............................ 174/36 |

FOREIGN PATENT DOCUMENTS

| 7206455 | 5/1972 | Fed. Rep. of Germany . |
| 804362 | 10/1936 | France . |
| 2431271 | 3/1980 | France ................................... 5/502 |
| 2478985 | 10/1981 | France ................................... 5/482 |

Primary Examiner—A. T. Grimley
Assistant Examiner—D. A. Tone
Attorney, Agent, or Firm—Cushman, Darby & Cushman

[57] ABSTRACT

Protective cover against radiation consisting of a first special foil, which has a metallized lateral surface (metallization layer) connectable with ground potential by a grounding cord, on a plastic carrier foil and which preferably is disposed between two layers made of a plastic protective foil, characterized in that adjacent to the first special foil, an additional, second special foil is disposed.

5 Claims, 8 Drawing Figures

PROTECTIVE COVER AGAINST RADIATION

According to one aspect, the invention relates to a cover for protection against rays or absorption of rays consisting of a special foil which has a lateral surface (metal layer) on a plastic carrier foil that can be connected with earth potential by a grounding cord, and which preferably is disposed in the manner of a sandwich between two layers made of a plastic protective foil.

In the case of a protective cover against radiation which is already known and according to the German utility patent No. 7206455, a certain protection will be achieved against cold and humidity, and furthermore a certain screening against radiation will be achieved.

The known protective covers against radiation however are not to be considered in every respect as being satisfactory, and the present invention provides for known protective covers against radiation for the avoidance of the disadvantages that in the case of a protective cover against radiation of the initially mentioned type, adjoining a first special foil, an additional second foil is disposed which likewise may be connected by the grounding cord with earth potential. Preferably, one and the same grounding cord is connected on the one hand with the two metal layers of the special foils and on the other hand with the earth potential.

Preferably, the first and the second special foils are disposed such that their plastic carrier foils lie on top of one another.

According to a further aspect of the invention, a protective layer against radiation is provided which has two special foils disposed adjoining one another, whereby each of these special foils has a plastic carrier foil which carries on the one side a silver layer and on the other, oppositely lying side a gold layer. Preferably, the two special foils are disposed in such a way that always the gold layers face one another. In this preferred case then, the silver layers face the outside.

Additional advantages of the development of the invention will result especially from the subclaims.

Further advantages, goals and details of the invention will result from the description of embodiments by way of example based on the drawing; in the drawing FIG. 1 shows a schematic view of the protective cover against radiation;

Figure 1:
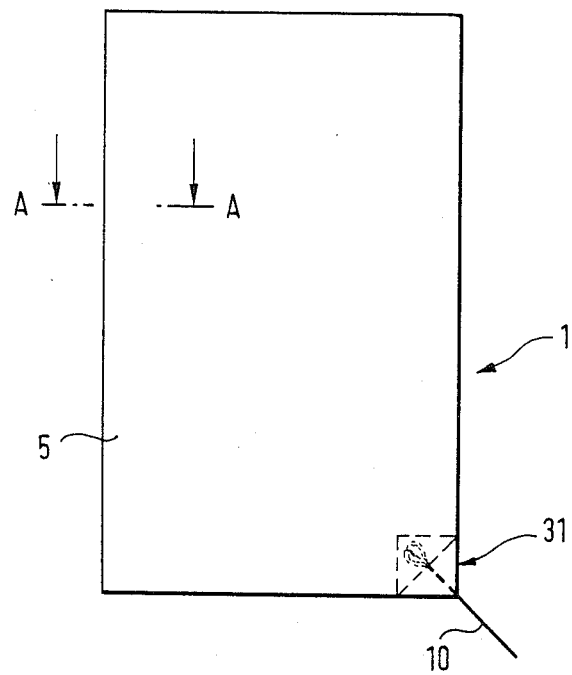
Figure 2:
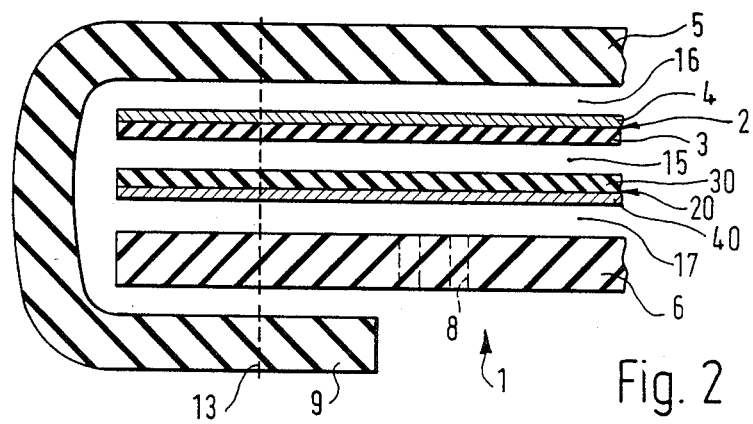
FIG. 2 shows a partial cut along the line A—A in FIG. 1.

The protective cover 1 against radiation constructed according to the invention has an outer wrapping consisting of two plastic protective foils 5 and 6, whereby the plastic protective foil 5 lying on top in the FIGS. 1 and 2, has a wrapping part 9 in order to overlap with the plastic protective foil 6 in the manner shown in FIG. 2. Two special foils 2, 20 have about the same size as the plastic protective foil 6 and are sewn together near their edges with the plastic protective foil 5 as well as in their cover part 9 in the manner shown in FIG. 2 at 7. Depending on the desired area of protection, the protective cover 1 against radiation may be produced in various sizes, for example, in the size of a bed.

The special foils 2, 20 are produced, for example, by the firm Dupont and always consist of a thin, plastic carrier foil 3, 30 with a thin metal layer 4, 40 steamed onto it. The two special foils 2, 20 may be glued together over their entire surface of contact, but preferably they are merely put one on top of the other so that an air layer 15 is formed between the two special foils 2, 20. Additional air layers 16, 17 are located between the special foils 2, 20 and the adjoining plastic protective foils 5 or 6. The plastic protective foils 5, 6 may be of such a variety as are used in the case of automobile production for the lining of the automobile roof. Correspondingly, a multitude of holes 8 (of which only a few are shown) may be provided in the plastic protective foils 5, 6.

Figure 3:
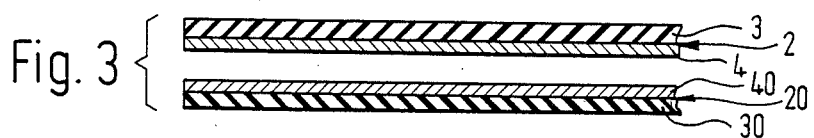
FIG. 3 shows a cut through another embodiment of the special cover according to the invention by way of example.

According to the invention, the two special foils 2, 20 may be disposed in the manner shown in FIG. 2, that is to say, the plastic carrier foils 3, 30 point in the direction facing one another which is advantageous particularly for medicinal purposes. However, it is also possible to dispose the two special foils 2, 20 in the manner shown in FIG. 3 or 4, that is to say, according to FIG. 3, the two metal layers 4, 40 point toward one another, while according to FIG. 4, the arrangement is made alternatingly, that is to say, the metal or metallization layer 4 of the special foil 2 points toward the plastic carrier foil 30 of the special foil 20. The arrangement according to FIG. 3 is particularly useful for pure screening purposes and to be sure especially for the use in the case of a television device as well as in the treatment room of a doctor.

Figure 4:
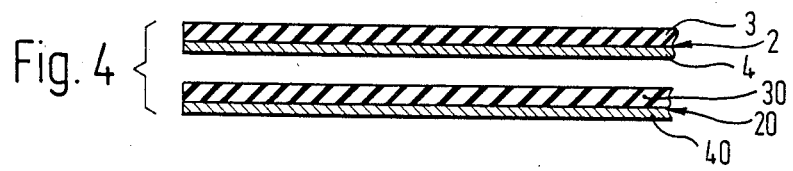
FIG. 4 shows a partial cut through a third embodiment given by way of example of the protective cover against radiation according to the invention.

In the case of the arrangement according to FIG. 4, there results a stronger absorption than in the case of the use of only one special foil.

Figure 5:
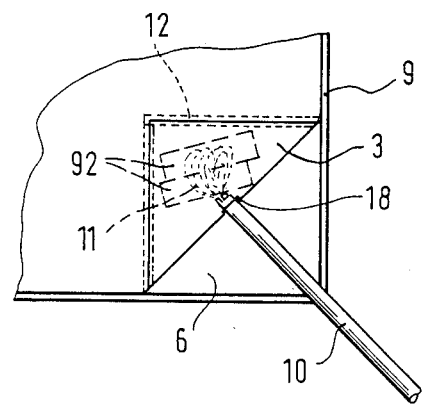
FIG. 5 shows the type of connection of the grounding cord to the protective cover against radiation, preferred according to the invention.

In FIG. 5, the connection of the grounding cord 10 with the special foils 2, 20 according to the invention is shown in detail. The end of the grounding cord 10 freed of its insulation is divided into two parts 11 of cords, whereby only the one part 11 of the cord is shown in FIG. 5, while the other part 11 of the cord cannot be seen in FIG. 5. The type of connection shown in FIG. 5 is valid for the embodiment shown in FIG. 2, by way of example, but logically it may also be used in the case of the FIGS. 3 and 4. Before, in the area of one corner 31 of the protective cover 1 against radiation, the plastic protective foil 5 is sewn together with its wrapping part 9 as well as with the plastic protective foil 6 and the wrapped special foils 2, 20, always one hole 18 (as can be seen in FIG. 5) is cut out in the triangular, folded special foil 2 and 20, so that a portion 11 of the cord is guided through the hole 18 in the special foil 2 and the other portion of the cord through the hole 18 in the special foil 20 inwards into the triangularly shaped wrapping range. In the triangularly shaped wrapping range of the special foil 2 as well as of the special foil 20, each part 11 of the cord is spread out like a fan in the manner shown in FIG. 5 on the metallization layer 4 or 40 located there and is attached on this layer, for example, by Tesa film strips 92, so that a good contact secured over a large surface between the cord part 11 and the metallization layer 4 or 40 results. An additional contact results between the pertinent cord portion 11 and the triangularly folded part of each special foil 2, 20. As a result of an additional adhesive strip 12, for example, a Tesa strip, the folded, triangular part of the special foil 2, 20 is kept in contact with its main part. The grounding cord 10 may also be glued together with its not insulated part still continuing inside of the area of the protective cover 1 against radiation, likewise in a manner not shown, with the plastic protective foil 5. After this connection of the grounding cord 10 has been accomplished, the sewing process for closing the protective cover 1 against radiation may also be carried out in the area of the corner 31.

Figure 6:
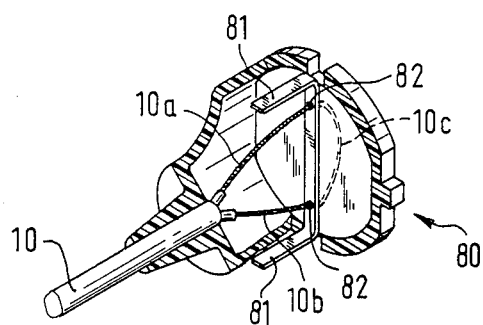
FIG. 6 shows a preferred development of the grounding plug according to the invention.
Figure 7:
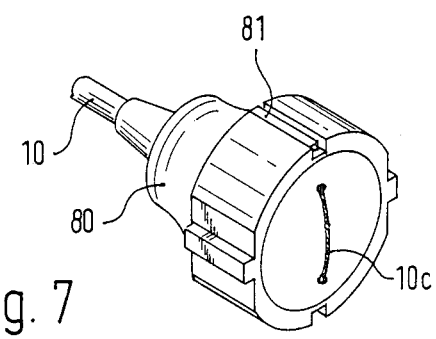
FIG. 7 shows another view of the grounding plug according to FIG. 6.

FIGS. 6 and 7 show a plug 80 by means of which the grounding cord 10 may be connected with the earth potential present in the protective contact plug socket in an advantageous manner. This plug 80 has the customary grounding contacts 81, whereby according to the invention, the cord 10 is split into two parts 10a and 10b which are connected with one another in the manner of a loop at 10c and furthermore also at 82 with the grounding contacts 81.

Figure 8:
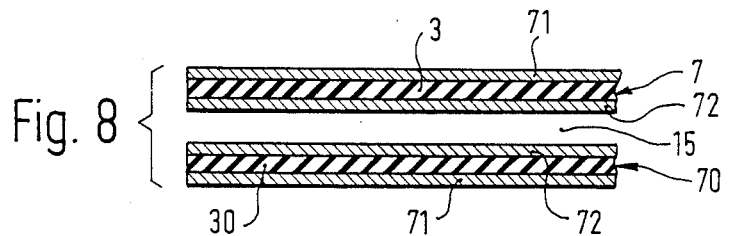
FIG. 8 shows a further preferred embodiment by way of example of a protective cover against radiation and according to the invention, whereby, as in the case of the presentation according to FIG. 3, the plastic, protective foils are always omitted.

In FIG. 8, another additional, particularly preferred embodiment of a protective cover against radiation developed according to the invention has been shown by way of example. The plastic protective foils 5 and 6 shown in FIG. 2 are in this case not shown similarly as in the case of FIG. 3. The protective cover against radiation according to the invention and developed according to FIG. 8 has two special foils 7, 70. The special foil 7 is developed identical to the special foil 70. The special foil 7 has a plastic carrier foil 3, and the special foil 70 has a plastic carrier foil 30. Onto these plastic carrier foils 3, 30, there are always metal layers 71, 72 applied on both sides, preferably steamed on. Preferably, the metal layer 71 which in the case of the overall arrangement according to FIG. 8 lie on the outside, are provided as silver layers, while the two inside lying layers 72 are gold layers. In case of the finished cover, the two gold layers 72, 72 thus lie on top of one another, whereby generally however a certain layer of air 15 develops similarly as shown FIG. 2.

The metal layers 71, 72 are always connected with the grounding cord 10, not shown in FIG. 8.

I claim:

1. A cover adapted to provide protection against radiation, said cover comprising:

first foil means comprising a plastic carrier foil with metalization layers applied on both sides of said carrier foil, second foil means comprising a plastic carrier foil with metalization layers applied on both sides of said carrier foil, said first and second foil means being arranged on top of each other such that a layer of air is provided between the two layers facing each other, a first plastic protective foil arranged adjacent said first foil means and forming a layer of air therebetween, a second plastic protective foil arranged adjacent said second foil means and forming a layer of air therebetween, and a grounding cord connected to said metallization layers.

2. The cover as in claim 1, wherein the grounding cord is split into cord parts each of which in the manner of a fan is connected with a said one of said metallization layers.

3. The cover as in claim 2, wherein in each of said foil means, one hole is provided to permit said cord parts to extend therethrough and to allow folding of the corner parts of said first and second foil means.

4. The cover as in claim 1, wherein the connection of the cord with the one or several metallization layers is accomplished by adhesive strips.

5. The cover of claim 1, wherein each foil means comprise a thin carrier foil of plastic, which is coated on the one side with silver and on the other side with gold, said foil means being arranged such that the two gold layers are disposed adjacent to one another, while the two silver layers always point to the outside.

* * * * *